United States Patent [19]

Reichert

[11] Patent Number: 4,545,109
[45] Date of Patent: Oct. 8, 1985

[54] METHOD OF MAKING A GALLIUM ARSENIDE FIELD EFFECT TRANSISTOR

[75] Inventor: Walter F. Reichert, East Brunswick, N.J.

[73] Assignee: RCA Corporation, Princeton, N.J.

[21] Appl. No.: 459,756

[22] Filed: Jan. 21, 1983

[51] Int. Cl.[4] .................. H01L 21/205; H01L 21/302
[52] U.S. Cl. ................................... 29/571; 29/576 E;
29/578; 29/580; 148/175; 148/DIG. 50;
148/DIG. 88; 148/DIG. 139; 148/DIG. 26;
156/644; 156/649; 156/659.1; 156/662; 357/22;
357/15
[58] Field of Search ............ 148/17 S; 29/571, 576 E,
29/578, 580; 156/644, 648, 649, 659.1, 662;
357/22 G, 22 P, 22 S, 15 GA

[56] References Cited

U.S. PATENT DOCUMENTS

| | | | |
|---|---|---|---|
| 3,375,417 | 3/1968 | Hull et al. | 148/175 X |
| 3,764,865 | 10/1973 | Napoli et al. | 317/235 |
| 3,804,681 | 4/1974 | Drangeid et al. | 29/571 X |
| 4,111,725 | 9/1978 | Cho et al. | 29/571 X |
| 4,186,410 | 1/1980 | Cho et al. | 29/571 X |
| 4,265,934 | 5/1981 | Ladd | 148/175 X |
| 4,266,333 | 5/1981 | Reichert | 29/571 |
| 4,377,899 | 3/1983 | Otani et al. | 29/580 X |
| 4,426,767 | 1/1984 | Swanson et al. | 29/578 X |
| 4,429,452 | 2/1984 | Meignant | 29/571 |

OTHER PUBLICATIONS

Von Muench, W., "Producing . . . Devices by Oriented Lateral Overgrowth" I.B.M. Tech. Discl. Bull., vol. 10, No. 10, Mar. 1968, pp. 1469-1470.
Fukuta et al., "Power GaAs MESFET . . . Voltage" IEEE Trans. Microwave Theory & Tech., vol. MTT-24, No. 6, Jun. 1976, pp. 312-317.
"Single Crystal GaAs Films on Amorphous Substrates by the CLEFT Process" C. O. Bozler, et al., J. Vac. Sci. Technol., 20(3), Mar. 1982, pp. 720-725.
"Vapor Phase Growth of Several III-V Compound Semiconductors" J. J. Tietjen et al., Solid State Technol, Oct. 1972, pp. 42-49.

Primary Examiner—William G. Saba
Attorney, Agent, or Firm—B. E. Morris; D. S. Cohen

[57] ABSTRACT

A method of producing a high frequency III-V FET and the resultant structure is described wherein a doped layer is formed on a wafer of undoped, semi-insulating III-V material. The structure is then etched to form a mesa after which, a channel region is regrown from an exposed portion of the III-V substrate. The formation of the channel region defines the source and drain regions. Ohmic contacts are then made to the source and drain regions after which a Schottky contact is made to the channel region.

8 Claims, 12 Drawing Figures

METHOD OF MAKING A GALLIUM ARSENIDE FIELD EFFECT TRANSISTOR

The Government has rights to this invention pursuant to a Government contract.

BACKGROUND OF THE INVENTION

This invention relates to semiconductor devices and the processing thereof and more particularly to III-V compound devices and a method of producing such field effect transistors.

With the advent of higher frequency semiconductor devices, especially in the field of gallium arsenide Field Effect Transistors (FET), there is a need for decreasing the source-to-gate resistance as well as the drain-to-gate resistance in order to more effectively operate at the higher frequency. Accordingly, the prior art methods of manufacturing gallium arsenide FET's which are to operate at these higher frequencies must be reviewed since these prior methods tend to produce devices that are frequency limited in that they exhibit excessive amounts of resistance, inductance as well as capacitance. Especially, in devices to be operated in the gigahertz portion of the spectrum and higher, the inductance associated with the gate, source and drain contacts must be carefully tailored in order not to introduce any unnecessary frequency limiting inductance. Similarly, if the device is to be operated in the gigahertz portion of the radio frequency spectrum, the source-to-gate resistance as well as the drain-to-gate resistance must be maintained as low as possible.

One method of producing a gallium arsenide FET is described in my U.S. Pat. No. 4,266,333 which issued on May, 12, 1981 entitled "METHOD OF MAKING A SCHOTTKY BARRIER FIELD EFFECT TRANSISTOR" and assigned to the same assignee as the subject application. In my prior patent, a metal layer is first formed on a layer of gallium arsenide material and is subsequently defined to form spaced source and drain contacts. The structure is then covered with a thick layer of insulating material which is then masked and subjected to an isotropic etch. Thereafter, the gate member is deposited in the opening formed by the etch. While the above mentioned patent describes a viable method for producing gallium arsenide FET's the device so produced tends to have a limited upper frequency. Accordingly, I have devised the method of the subject application for producing a structure having reduced source-to-gate resistance as well as reduced drain-to-gate resistance and has the additional advantage of providing a very short gate contact. The net effect is to lower both the inductive and capacitive reactance and thus produce a device which will operate at higher frequencies than heretofore possible.

SUMMARY OF THE INVENTION

In the subject application, the described novel device and process achieves the desired high frequency gallium arsenide FET by first forming a highly n+ doped gallium arsenide layer on a wafer of undoped, semi-insulating gallium arsenide. A mesa is then formed on the top surface of the substrate. The next steps of masking and defining a gate region will, by its very method, also define the source and drain regions. Thereafter, the channel region is regrown between the source and drain regions. By using this method, the channel dimension is minimized and thus provides a device having low resistance as well as reduced inductance and capacitance.

DETAILED DESCRIPTION OF THE INVENTION

In the following description, it should be noted that similar elements, in the various FIGURES, will be similarly numbered.

Figure 1:
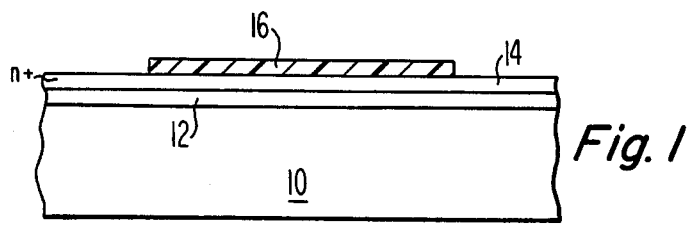
FIGS. 1-10 inclusive, represents cross-sectional, elevation views of the process of one embodiment of the subject invention indicating the resultant structures during the processing of forming a high frequency gallium arsenide FET.
Figure 2:
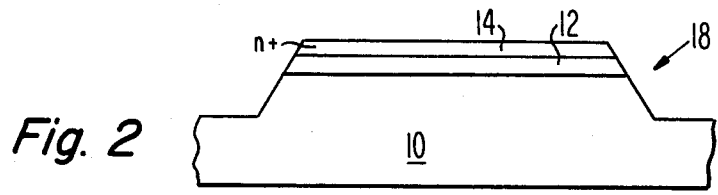
Figure 3:
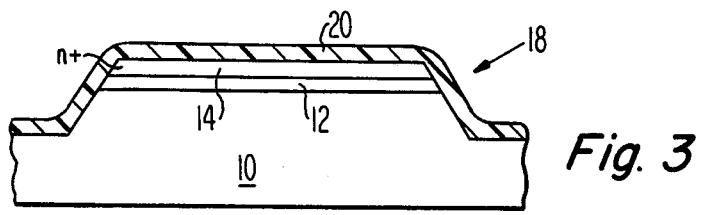

Referring now to FIG. 1 there is shown a substrate 10 of, for example, semi-insulating gallium arsenide having an undoped buffer layer 12, which may be formed from the vapor phase, that is then capped with a highly doped n+ layer of gallium arsenide 14. It should be noted that buffer layer 12 may be formed using a chemical vapor deposition technique, as is well known in the art, and has a thickness of about 2-5 $\mu$m (microns) deep and layer 14 has an n+ dopant concentration of about $10^{18}/cm^3$ and a thickness of about 0.2-0.5 microns. Layer 14 has been doped with, for example, silicon to provide the required n+ concentration. Thereafter, the upper surface of layer 14 is provided with a layer of photoresist material 16 which photoresist will define the area wherein a gallium arsenide mesa is to be formed. As shown in FIG. 2, the structure is then subjected to either an isotropic chemical etch or to an ion milling etch to form mesa 18. Thereafter, as shown in FIG. 3, the device is provided with a layer of silicon dioxide (SiO$_2$) which, for example, may be formed by a chemical vapor deposition technique, as is well known in the art.

Figure 4:
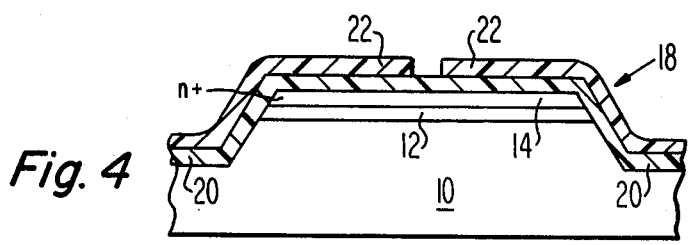
Figure 5:
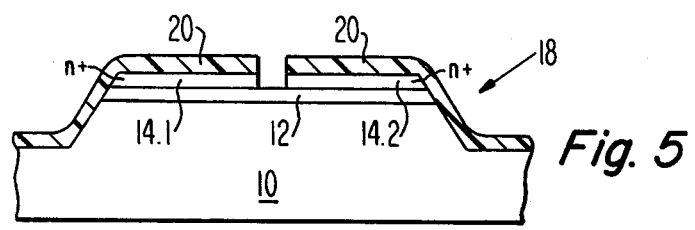

As shown in FIG. 4, mesa 18 is now provided with an apertured masking layer 22 which is utilized to subsequently define the channel region. Thereafter, as shown in FIG. 5, the structure is subjected to either a chemical or plasma etch wherein the exposed portion of SiO$_2$ layer 20 is etched down to layer 14 and the now exposed portion of doped layer 14 is etched down to buffer layer 12 effectively forming source region 14.1 and drain region 14.2.

Figure 6:
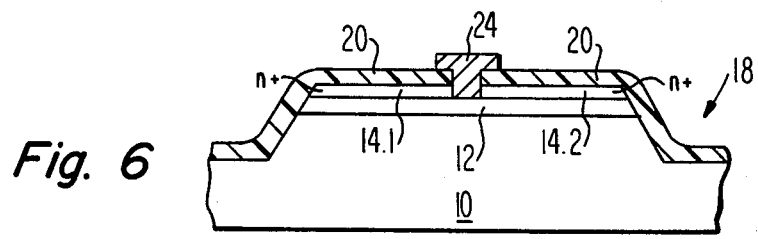

As shown in FIG. 6, mesa 18 is now subjected to a gallium arsenide regrowth step in order to produce channel region 24. Sufficient n+ dopant (such as silicon) is introduced during the regrowth step in order to provide channel region 24 with a doping density of the order of about $10^{17}/cm^3$. This regrowth processing has been detailed in an article by C. O. Bozler et al. entitled "SINGLE-CRYSTAL GaAs FILMS ON AMORPHOUS SUBSTRATES BY THE CLEFT PROCESS", J. Vac. Sci. Technol., 20 (3) March, 1982. In this article, the authors describe a process for regrowing gallium arsenide crystals from a surface orientation in the [110] crystallographic plane and, by utilizing the teachings of the article, the regrown crystals will grow laterally over the top of the SiO$_2$ layer 20 to form a "T" shaped channel region. The lateral regrowth of the gallium arsenide crystal, as compared to vertical regrowth of the crystals, controls the proximity of the channel region of the source and drain regions. This growth is dependent on the crystallographic orientation of the top surface of mesa 18 where the aperture in which the crystal is regrown is defined as being oriented about 20° to the single [110] cleavage plane of the underlying crystal.

Having formed channel region 24 it should now become obvious that current will now normally flow through the n+/n/n+ regions 14.1, 24 and 14.2 and, that when channel region 24 is appropriately biased, current will be entirely pinched-off.

Figure 7:
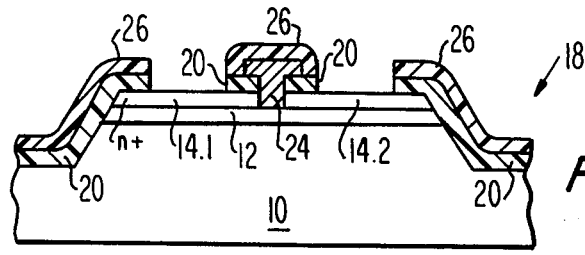
Figure 8:
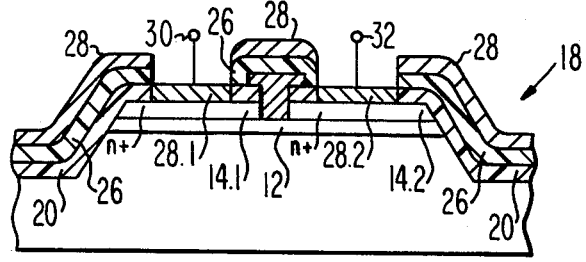

Contact is now made to the source and drain regions 14.1 and 14.2 and this is done, as shown in FIG. 7, by applying an aperture layer of photoresist 26 to the top surface of $SiO_2$ layer 20 in order to define the source and drain contacts. The openings in photoresist mask 26 are used to etch corresponding openings in $SiO_2$ layer 20 to expose source and drain regions 14.1 and 14.2 while maintaining channel region 24 masked. Thereafter, as shown in FIG. 8, ohmic contacts are formed by depositing a standard AuGe/Ni/Au layered alloy. In this situation, the entire wafer is covered with the deposited alloy metal and the well-known lift off technique is utilized whereby when photoresist layer 26 is removed all of the desired metal deposited thereon is also removed leaving only contacts 28.1 and 28.2 in ohmic contact with source region 14.1 and drain region 14.2 respectively. It should be understood that these contacts may also be extended to contact pads shown here symbolicly as pads 30 and 32 respectively.

Figure 9:
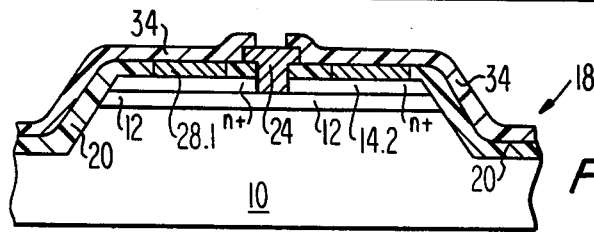
Figure 10:
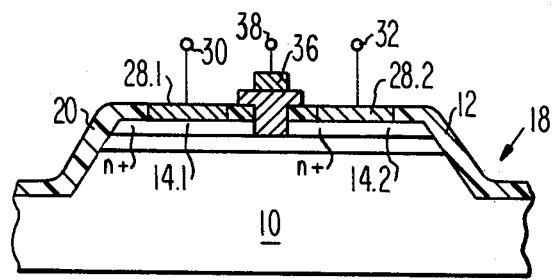

Having formed source and drain contacts 28.1 and 28.2, the structure is again provided with an apertured layer of photoresist material 34 as shown in FIG. 9 wherein the aperture is aligned with channel region 24. A Schottky contact metal is then deposited over the entire structure, using the same lift off technique as previously described, to produce contact 36 in Schottky contact with channel member 24, as shown in FIG. 10. To complete the device, as with the source and drain contacts, the Schottky contact metal may be run out to a pad member positioned at the edge of the chip and is shown here symbolically as pad 38.

Figure 11:
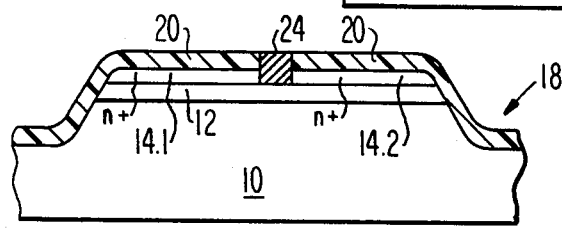
FIGS. 11 and 12, inclusive represent cross-sectional, elevation views of the variation in processing steps of the subject invention for forming another embodiment of my novel device.
Figure 12:
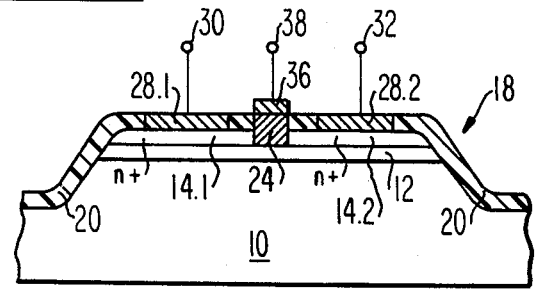

Referring now to FIGS. 11 and 12 there is shown another embodiment which may be produced by my novel method, that also may be used to produce similar results. Insofar as this latter embodiment is concerned, the processing is identical with the first embodiment, through FIGS. 1–5. Thereafter, as shown in FIG. 11, channel member 24 is formed without the lateral overgrowth described in the C. O. Bozler et al. article. The processing is continued through FIGS. 7 and 8 and the masking layer 34 is deposited as in FIG. 9. Thereafter, when the Schottky contact is made using the well-known lift off technique the contact 36 shown in FIG. 12 will be produced.

Thus, I have described a method which may be employed to produce the required Schottky metal contact on the top surface of channel region. Current can now be made to flow through line 30, source contact 28.1, through n+ source region 14.1, through the regrowth n layer 24, and into n+ drain region 14.2, drain contact 28.2 and into line 32. The Schottky contact/channel 36/24, with the proper bias applied to line 38 will pinch-off in the area of the overgrowth 24 and thus, prevent current flow in the device.

As will be seen by those skilled in the art, the source and drain resistance has been appreciably lowered by the close proximity of contacts 28.1 and 28.2 to channel contact 36. Further, by making the contacts as small as possible with my novel process the inductance in the resultant structure has also been reduced significantly thereby allowing the device to operate at higher frequencies than heretofore possible.

Additionally, while I have described a process and the resultant structure in terms of a gallium arsenide device, it should now be obvious to those skilled in the art that various other III-V compounds may also be used without departing from the inventive concept.

What I claim is:

1. A method of producing a semiconductor device, comprising the steps of:
    forming a doped layer of a III-V compound material on the surface of a substrate of semi-insulating III-V compound material, the layer doped to a first concentration of a given conductivity type;
    forming a mesa by etching through portions of the doped layer and partially through the thickness of the substrate;
    forming a first aperture in the doped layer to expose a portion of the substrate;
    growing a channel region of the III-V compound material in the aperture to a sufficient thickness to extend laterally, partially over and insulated from the surface of the doped layer, the channel region doped to a second, lower concentration of the given conductivity type;
    forming a Schottky contact to the channel region; and
    forming ohmic contacts on the surface of the doped layer which are positioned such that the ohmic contacts are spaced apart from the channel region.

2. The method of claim 1 comprising the further step of depositing a layer of insulating material on the doped layer;
    etching through the insulating material and the doped layer; and
    forming second apertures in the layer of insulating material to expose portions of the doped surface for ohmic contact thereto.

3. The method of claim 1 wherein the step of forming a mesa comprises:
    applying a layer of photoresist to areas of the doped layer;
    etching through the exposed doped layer, and portions of the substrate; and
    removing the layer of photoresist.

4. The method of claim 3, wherein:
    the doped layer is doped with silicon to a depth of about 0.2–0.5 microns.

5. The method of claim 4, wherein:
    the first concentration of dopant is of the order of about $10^{18}/cm^3$; and
    the second concentration of dopant is of the order of about $10^{17}/cm^3$.

6. The method of claim 5, comprising the further step of:
    growing the channel region in the first aperture to a sufficient thickness to extend laterally, partially over the surface of the layer of insulating material.

7. The method of claim 6, wherein:
    the Schottky contact is formed by depositing successive layers of a AuGe/Ni/Au alloy on the channel region.

8. The method of claim 7, wherein:
    the III-V compound material is gallium arsenide.

* * * * *